United States Patent
Yamamoto et al.

(10) Patent No.: US 9,637,649 B2
(45) Date of Patent: May 2, 2017

(54) CURABLE RESIN COMPOSITION CONTAINING SILOXANE RESIN HAVING POLYSILSESQUIOXANE STRUCTURE, OPTICAL MEMBER SET, METHOD OF PRODUCING THE SAME, AND SOLID STATE IMAGING DEVICE USING THE SAME

(71) Applicant: FUJIFILM Corporation, Minato-ku, Tokyo (JP)

(72) Inventors: Keiji Yamamoto, Haibara-gun (JP); Kazuto Shimada, Haibara-gun (JP); Makoto Kubota, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 4 days.

(21) Appl. No.: 14/071,010

(22) Filed: Nov. 4, 2013

(65) Prior Publication Data
US 2014/0054738 A1    Feb. 27, 2014

Related U.S. Application Data

(63) Continuation of application No. PCT/JP2012/072663, filed on Aug. 30, 2012.

(30) Foreign Application Priority Data

Sep. 30, 2011 (JP) .................. 2011-217967
Dec. 28, 2011 (JP) .................. 2011-287850
Jul. 27, 2012 (JP) .................. 2012-167634

(51) Int. Cl.

| C09D 7/12 | (2006.01) |
|---|---|
| C09D 183/04 | (2006.01) |
| G02B 1/11 | (2015.01) |
| G02B 1/04 | (2006.01) |
| G02B 3/00 | (2006.01) |
| H01L 31/0232 | (2014.01) |
| C08G 77/04 | (2006.01) |

(52) U.S. Cl.
CPC ......... *C09D 7/1233* (2013.01); *C09D 183/04* (2013.01); *G02B 1/043* (2013.01); *G02B 1/11* (2013.01); *G02B 3/00* (2013.01); *H01L 31/0232* (2013.01); *H01L 31/02325* (2013.01); *C08G 77/045* (2013.01)

(58) Field of Classification Search
CPC ......... H01L 27/14685; H01L 27/14627; H01L 27/14621; H01L 27/1464; H01L 27/14623; H01L 27/14625; H01L 27/14636; H01L 27/14687; H01L 27/14643; H01L 27/1463; H01L 27/14645; H01L 27/14689; H01L 31/02; H01L 31/02325; H01L 31/0232; C09D 7/1233; C09D 183/04; G02B 3/00; G02B 1/043; G02B 1/11; C08G 77/045

See application file for complete search history.

(56) References Cited

U.S. PATENT DOCUMENTS

| 8,697,330 B2 | 4/2014 | Ogihara et al. | |
|---|---|---|---|
| 2003/0134951 A1 | 7/2003 | Yamaya et al. | |
| 2003/0139486 A1* | 7/2003 | Yamada et al. | ............. 522/71 |
| 2007/0117252 A1* | 5/2007 | Ogihara | ............. C08G 77/48 438/72 |
| 2008/0199789 A1* | 8/2008 | Abdallah | ............. C09D 183/06 430/21 |
| 2011/0171447 A1* | 7/2011 | Krishnamoorthy et al. | . 428/220 |

FOREIGN PATENT DOCUMENTS

| JP | 2003-206442 A | 7/2003 |
|---|---|---|
| JP | 2005-023258 A | 1/2005 |
| JP | 2005-148681 A | 6/2005 |
| JP | 2007-184322 A | 7/2007 |
| JP | 2008-151998 A | 7/2008 |
| JP | 2008-248239 A | 10/2008 |
| TW | 201120577 A | 6/2011 |

OTHER PUBLICATIONS

Communication dated Oct. 15, 2015 from the Taiwanese Patent Office in counterpart application No. 101131729.

* cited by examiner

*Primary Examiner* — John P Dulka
*Assistant Examiner* — Charles R Peters
(74) *Attorney, Agent, or Firm* — Sughrue Mion, PLLC

(57) ABSTRACT

A curable resin composition, for forming a first optical member of an optical member set, the optical member having the first optical member and a second optical member covered with the first optical member, the first optical member being formed by curing a siloxane resin, comprising: a siloxane resin, a surfactant, and a solvent, the siloxane resin and the surfactant being contained in the solvent, the surfactant having a polyoxyalkylene structure, the siloxane resin being defined in 65% by mass to 100% by mass thereof having a particular polysilsesquioxane structure.

16 Claims, No Drawings

CURABLE RESIN COMPOSITION CONTAINING SILOXANE RESIN HAVING POLYSILSESQUIOXANE STRUCTURE, OPTICAL MEMBER SET, METHOD OF PRODUCING THE SAME, AND SOLID STATE IMAGING DEVICE USING THE SAME

TECHNICAL FIELD

The present invention relates to a curable resin composition, an optical member set, a method of producing the same, and a solid state imaging device using the same.

BACKGROUND ART

Recently, there are a wide variety of types of optical devices, and many of them have a structure in which an antireflective, low-refractive index film is formed on the surface of an optical instrument. The optical instrument is not limited to devices having flat surface morphologies, and includes brightness enhancing lenses and diffusion lenses in the backlights for liquid crystal displays, Fresnel lenses and lenticular lenses used in screens of video projection televisions, microlenses, and the like. In such the devices, desired geometric-optical performance is obtained as a resin material mainly forms a microstructure. Thus, in order to impart an antireflection property, it is necessary to form a low refractive index film in an appropriate form on the surface of such a microstructure body.

Research and development has been hitherto achieved on a material for forming the low refractive index film. For example, it has been suggested to use a polysiloxane that is obtained by condensing a silane compound having a radical polymerizable organic group, a silane compound having a fluorine atom, and an alkoxysilane compound (see Patent Literature 1 and the like). It is reported that the unevenness of a coating film in the vicinity of the wall portion of the structure can be improved thereby.

CITATION LIST

Patent Literature

Patent Literature 1: JP-A-2008-248239 ("JP-A" means unexamined published Japanese patent application)

DISCLOSURE OF INVENTION

Technical Problem

As described above, examples of applying a siloxane-based resin-cured film as a coating material for optical devices are available so far, and thus development of the material has been conducted. On the other hand, a resin film that constitutes conventional antireflective films and the like forms a very thin film having a thickness of approximately several ten nanometers, or coats a structure having a simple form such as described above. However, recently, upon receiving suggestions on new device structures or applications, a material which is made to have a thickness of up to the order of micrometers and thereby appropriately embeds complicated concavity and convexity is desired. On the other hand, a material which realizes satisfactory embedding property, and planarization/surface state when made to have such the thickness, and which satisfies the optical characteristics required as a transparent cured film, is not necessarily known, and further research and development is required.

Thus, the present invention addresses to the provision of a lens unit (optical member set), which realizes a desired refractive index and satisfactory light transmissibility even if the resin film that constitutes the antireflective film or the like has some thickness, and includes a light-transmissive cured film (first optical member) having satisfactory planarization of the surface, fillability of concavity and convexity (embedding property), and very excellent surface state, and a solid state imaging device. Further, the present invention addresses to the provision of a production method and a resin composition, which are appropriate for the production of a lens unit (optical member set) having the excellent characteristics described above.

Solution to the Problem

According to the present invention, there is provided the following means:

(1) A curable resin composition, for forming a first optical member of an optical member set, the optical member set having the first optical member and a second optical member covered with the first optical member, the first optical member being formed by curing a siloxane resin, the curable resin composition comprising:
a siloxane resin, a surfactant, and a solvent,
the siloxane resin and the surfactant being contained in the solvent,
the surfactant having a polyoxyalkylene structure, and
the siloxane resin being defined in 65% by mass to 100% by mass thereof having a polysilsesquioxane structure represented by formula (1):

   Formula (1)

wherein $R^1$ represents an alkyl group having 1 to 3 carbon atom(s); and n represents an integer of 20 to 1,000.

(2) The curable resin composition as described in the item (1),
wherein the content of the surfactant is within a range from 1 part by mass to 30 parts by mass, relative to 100 parts by mass of the siloxane resin.

(3) The curable resin composition as described in the item (1) or (2), wherein the solvent is an organic solvent.

(4) The curable resin composition as described in any one of the items (1) to (3),
wherein the siloxane resin is a resin obtained by hydrolytic condensation of an alkyltrialkoxysilane represented by formula (2) as a raw material, $$R^2Si(OR^3)_3 \qquad \text{Formula (2)}$$

wherein $R^2$ represents an alkyl group having 1 to 3 carbon atom(s); and $R^3$ represents an alkyl group.

(5) An optical member set, comprising:
a first optical member and a second optical member covered with the first optical member, the first optical member formed by curing a siloxane resin;
the siloxane resin being defined in a proportion from 65% by mass to 100% by mass thereof having a silsesquioxane structure represented by formula (1), and
the first optical member containing a surfactant having a polyoxyalkylene structure,

   Formula (1)

wherein $R^1$ represents an alkyl group having 1 to 3 carbon atom(s); and n represents an integer of 20 to 1,000.

(6) The optical member set as described in the item (5), wherein the first optical member has a refractive index of 1.36 to 1.44.
(7) The optical member set as described in the item (5) or (6), wherein the second optical member has a refractive index of 1.85 to 1.95.
(8) The optical member set as described in any one of the items (5) to (7), wherein the first optical member has a film shape and the film thickness thereof is from 0.5 μm to 3.0 μm.
(9) The optical member set as described in any one of the items (5) to (8), wherein the second optical member is a microlens member.
(10) A method of producing an optical member set, the optical member set having a first optical member and a second optical member coated with the first optical member, the first optical member being formed by curing a siloxane resin, the method comprising the steps of:
preparing a coating liquid containing a siloxane resin and a surfactant in a solvent, the siloxane resin being defined in 65% by mass to 100% by mass thereof having a silsesquioxane structure represented by formula (1), the surfactant having a polyoxyalkylene structure;
applying the coating liquid on the second optical member; and
curing the coating liquid and thereby forming the first optical member of a light-transmissive cured film,

 Formula (1)

wherein $R^1$ represents an alkyl group having 1 to 3 carbon atom(s); and n represents an integer of 20 to 1,000.
(11) The method of producing an optical member set as described in the item (10), having the steps of: heating the cured first optical member; and thereby conducting a postbake.
(12) A solid state imaging device, having the optical member set as described in any one of the items (5) to (9), and a semiconductor light-receiving unit.

Advantageous Effects of Invention

The microlens unit (optical member set) and solid state imaging device of the present invention are such that even when a thick light-transmissive cured film (first optical member) is formed, satisfactory planarization of the surface and fillability (embedding property) at concavity and convexity parts are realized, and the microlens unit and the solid state imaging device also have a very excellent surface state. Further, the microlens unit and the solid state imaging device have a desired refractive index and satisfactory light transmissibility, and exhibit excellent optical performance.

Further, the producing method and resin composition of the present invention are useful for the production of a microlens unit (optical member set) and a solid state imaging device, which exhibit excellent performance described above.

Other and further features and advantages of the invention will appear more fully from the following description.

MODE FOR CARRYING OUT THE INVENTION

The microlens unit (optical member set) of the preferable embodiment of the present invention includes a light-transmissive cured film (first optical member) containing a specific siloxane resin and a specific surfactant, and a plurality of microlens members (second optical member) coated with the light-transmissive cured film. A specific example of this lens unit may be a lens unit which is incorporated into a solid state imaging device (optical device), and includes a plurality of convex lenses, and a light-transmissive cured film that coats the convex lenses from their protruding direction. In on the present invention, when the specific siloxane resin and the specific surfactant are employed as the materials of the light-transmissive cured film, the optical characteristics, planarization, fillability (embedding property), surface state and the like such as described above are simultaneously realized. The reason for this is presumed as follows.

That is, in the present invention, since a specific siloxane resin is employed, this is cured, and thereby a silsesquioxane structure is contained in the light-transmissive cured film in a predetermined amount or more, it is construed that satisfactory planarization and fillability at concavity and convexity part are achieved even in a thickly applied film. It can be contemplated that as a result, satisfactory optical characteristics and high product quality are realized. Further, it can be speculated that when a specific surfactant is used in combination of the specific siloxane resin, the generation of protrusions at the time of forming a cured film by a postbake is suppressed, and very excellent surface state properties are realized. Hereinafter, a preferred exemplary embodiment of the present invention is described in connection with the specific siloxane resin and the specific surfactant. The optical member set, the first optical member, and the second optical member are explained by exemplifying a microlens unit, a light-transmissive cured film, and a microlens member, respectively.

<Light-Transmissive Cured Film (First Optical Member)>

In the present invention, the light-transmissive cured film is formed by curing a siloxane resin, and 65% by mass to 100% by mass of the siloxane resin contained in the cured film has a silsesquioxane structure represented by the formula (1) (hereinafter, also referred to as a "specific polysilsesquioxane structure"). The light-transmissive cured film in the present invention can be formed from a resin composition for forming a light-transmissive cured film, which contains a siloxane resin in a solvent. Hereinafter, the resin composition for forming a light-transmissive cured film is explained.

<Resin Composition for Forming a Light-Transmissive Cured Film (Curable Resin composition)>

The resin composition for forming a light-transmissive cured film in the present invention contain a siloxane resin.
(Siloxane Resin)

The siloxane resin having a silsesquioxane structure in the present invention can be obtained by using an alkoxysilane raw material that is described later, through a hydrolysis reaction and a condensation reaction. More specifically, the compound can be said to be a product in which a part or all of the alkoxy groups of an alkyltrialkoxysilane are hydrolyzed and converted to silanol groups, and at least a part of the produced silanol groups are condensed to form a Si—O—Si bond. The siloxane resin in the present invention may be a siloxane resin having any silsesquioxane structure of basket type, ladder type, or random type. With regard to the "basket type", "ladder type" and "random type", reference can be made to the structures described in, for example, Chemistry of Silsesquioxane Materials and Applications Thereof (CMC Publishing Co. Ltd.) and the like.

In the present invention, the siloxane resin has silsesquioxane structure represented by the following formula (1).

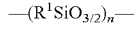 Formula (1)

(In formula (1), $R^1$ represents an alkyl group having 1 to 3 carbon atom(s); and n represents an integer of 20 to 1,000.)

The alkyl group represented by $R^1$ is not particularly limited as long as it has carbon atom(s) within the above range. Examples of the alkyl group include a methyl group, an ethyl group, a propyl group, and an isopropyl group. Among them, a methyl group and an ethyl group are preferable, and a methyl group is most preferable. Further, the alkyl group represented by $R^1$ may be an unsubstituted alkyl group or a substituted alkyl group, and an unsubstituted alkyl group is preferable.

The substituent, which the alkyl group represented by $R^1$ may have, preferably includes a halogen atom and a group not having an ethylenically unsaturated bond. Examples thereof include an amino group (preferably an amino group having 0 to 20 carbon atom(s), e.g. amino, N,N-dimethylamino, N,N-diethylamino, N-ethylamino, and anilino), a sulfonamide group (preferably a sulfonamide group having 0 to 20 carbon atom(s), e.g. N,N-dimethylsulfonamide and N-phenylsulfonamide), an acyloxy group (preferably an acyloxy group having 1 to 20 carbon atom(s), e.g. acetyloxy and benzoyloxy), a carbamoyl group (preferably a carbamoyl group having 1 to 20 carbon atom(s), e.g. N,N-dimethylcarbamoyl and N-phenylcarbamoyl), and an acylamono group (preferably an acylamono group having 1 to 20 carbon atom(s), e.g. acetyl amino and benzoylamino).

In the present invention, unless particularly stated otherwise, a silicon-containing polymer in which a main chain is composed of siloxane bonds is referred to as a polysiloxane or a siloxane resin. Since silicon has four bonding sites, the basic constituent units of polysiloxane are classified on the basis of how many organic groups represented by a methyl group or a phenyl group are present with respect to one silicon atom, and as is described below, the basic constituent units can be classified into four types. In the following formulae, R represents an organic group.

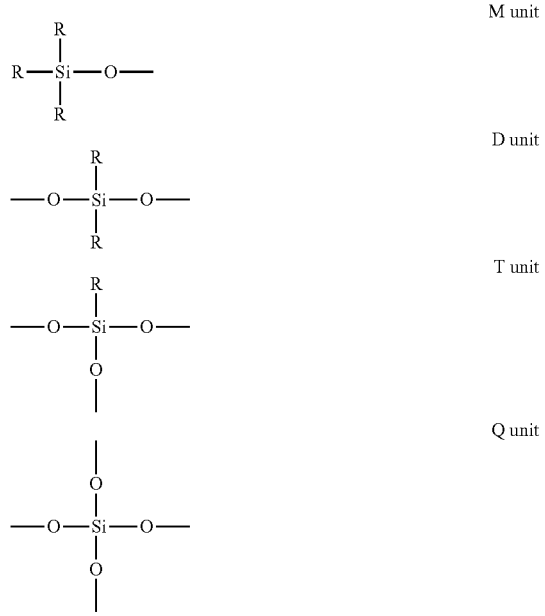

Further, in the present invention, unless particularly stated otherwise, the term "silsesquioxane" represents a generic name for polysiloxane, in which the basic constituent unit is T unit. Since silicon in silsesquioxane is bonded to three oxygen atoms, and oxygen is bonded to two silicon atoms, the theoretical composition is $RSiO_{3/2}$ (the Latin word meaning 3/2 is "sesqui"). In the present invention, R in the formula of a T unit described above is $R^1$, and this silsesquioxane structure moiety is incorporated at a specific content.

In the present invention, the siloxane resin is such that 65 mass % or more and 100 mass % or less of the total amount of siloxane resin contained in the cured film, that is, 65 mass % or more and 100 mass % or less of the total amount of the siloxane resin contained in the resin composition for forming a light-transmissive cured film is composed of the silsesquioxane structure. When the constitution proportion of the silsesquioxane structure is within the range described above, excellent planarization and embedding property of the microlens unit are obtained. The ratio is preferably 80 mass % or more and 100 mass % or less, more preferably 95 mass % or more and 100 mass % or less, most preferably substantially 100 mass % (however, even in the case of 100 mass %, other components such as inevitable impurities may be included to the extent that the desired effects are not impaired). In the present invention, the siloxane resin may contain one kind of a specific polysilsesquioxane structure, or may contain two or more kinds thereof.

The siloxane resin in the present invention is preferably a hydrolytic condensate obtainable by hydrolytic condensation of an alkyltrialkoxysilane.

(Alkyltrialkoxysilane)

In order to produce the hydrolytic condensate in the present invention, an alkoxysilane raw material containing an alkyltrialkoxysilane can be used as a starting raw material. The term "alkoxysilane raw material" represents a starting raw material composed of an alkoxysilane (silicon compound having an alkoxy group). When an alkyltrialkoxysilane is used as the raw material, the structure of the hydrolytic condensate thus obtainable becomes more flexible, and the presence of organic components in the raw material can enhance a wettability to a substrate. It is presumed that as a result, the condensate can be made to penetrate even to the bottom of the gaps, and embedding property has been enhanced. Further, it is construed that when the particular matrix is produced into a cured product, satisfactory surface state and planarization, and development resistance are realized while light transmissibility is maintained.

The alkyltrialkoxysilane is an organic silicon compound in which one alkyl group and three alkoxy groups are bonded to a silicon atom, and can be represented by the following formula (2).

$R^2Si(OR^3)_3$          Formula (2)

($R^2$ represents an alkyl group having 1 to 3 carbon atom(s), and $R^3$ represents an alkyl group.)

The alkyl group ($R^2$ in formula (2)) in the alkyltrialkoxysilane is not particularly limited as long as it has 1 to 3 carbon atom(s). Examples of the alkyl group include a methyl group, an ethyl group, a propyl group, and an isopropyl group. Among them, a methyl group and an ethyl group are preferable, and a methyl group is most preferable.

The alkoxy group in the alkyltrialkoxysilane is not particularly limited. Examples of the alkoxy group include a methoxy group and an ethoxy group. More specifically, as $R^3$ in formula (2), a straight chain or branched alkyl group having 1 to 20 carbon atom(s) is preferable. Especially, the number of carbon atoms is preferably from 1 to 10, and more preferably from 1 to 4. In particular, an ethoxy group, in which $R^3$ in formula (2) is an ethyl group, is preferable from the viewpoint of ease in control of hydrolysis rate.

Examples of the alkyltrialkoxysilane include methyltrimethoxysilane, methyltriethoxysilane, methyltripropoxysilane, ethyltrimethoxysilane, ethyltriethoxysilane, propyltrimethoxysilane, propyltriethoxysilane, and the like. Of these compounds, methyltriethoxysilane and ethyltriethoxysilane are favorably used and methyltriethoxysilane is most preferably used. The alkyltrialkoxysilane may be used as a component of either only one kind or in combination of two kinds or more.

65% by mass or more of the alkoxysilane raw material is preferably occupied by the alkyltrialkoxysilane. The content of the alkyltrialkoxysilane is more preferably from 80% by mass to 100% by mass of the alkoxysilane raw material, more preferably 95% by mass to 100% by mass. By controlling the content within the above range, a flexibility property of the structure of the hydrolysis condensate to be obtained and a wetting property with respect to a target material can be secured. As a result, the composition having an excellent embedding property can be obtained. Further, since surface state, planarization, and development resistance are further ameliorated when the raw material is produced into a cured film, it is preferable.

(Tetraalkoxysilane)

Other alkoxysilanes can be used in addition to the aforementioned trialkoxysilane as an alkoxysilane raw material. Among these alkoxysilanes, tetraalkoxysilane is preferable. Incorporation of the tetraalkoxysilane is preferable in the merits such that a cross-linking density in the hydrolysis condensate increases and electric insulation property and heat resistance of a coating film obtained by hardening are improved.

The tetraalkoxysilane is an organic silicon compound in which four alkoxy groups are bonded to a silicon atom, and can be represented by the following formula (3).

$$Si(OR^4)_4 \qquad \text{Formula (3)}$$

($R^4$s each independently represent an alkyl group.)

The alkoxy group of the tetraalkoxysilane is not limited in particular. Examples of the alkoxy group include a methoxy group and an ethoxy group. More specifically, as $R^4$ in formula (3), a straight chain or branched alkyl group having 1 to 20 carbon atom(s) is preferable. Especially, the number of carbon atom is preferably from 1 to 10, and more preferably from 1 to 4. In particular, an ethoxy group, in which $R^4$ in formula (3) is an ethyl group, is preferable, from the viewpoint of ease in control of hydrolysis rate.

Examples of the tetraalkoxysilane include tetramethoxysilane, tetraethoxysilane, tetra-n-propoxysilane, tetraisopropoxysilane, tetra-n-butoxysilane, tetra-isobutoxysilane, and tetra-tert-butoxysilane. Among them, tetramethoxysilane and tetraethoxysilane are favorably used.

The tetraalkoxysilane may be used as a component of either only one kind or in combination of two kinds or more.

The content of tetraalkoxysilane in the alkoxysilane raw material is not particularly limited, but from the viewpoint that the heat resistance of the development-resistant film of the composition becomes superior, the content is preferably 35% by mass or less, and more preferably 20% by mass or less. The lower limit is not particularly limited, but in the case of obtaining the effect of adding tetraalkoxysilane, the lower limit is preferably 0.01% by mass or more, and more preferably 0.1% by mass or more.

In the present specification, a showing of the compound is used to mean not only the compound itself, but also a salt or ion thereof and the like. Further, the showing of the compound is also used to mean incorporation of derivatives modified by a predefined configuration to an extent necessary to obtain a desired effect. Further in the present specification, a substituent (including a linking group) in which substitution or non-substitution is not explicitly stated means that the substituent may have any substituent. This is also applied to the compound in which substitution or non-substitution is not explicitly stated. Examples of preferable substituents include the following substituent T.

The substituent T includes the following substituents.

The subsutituents include an alkyl group (preferably an alkyl group having 1 to 20 carbon atom(s), for example, methyl, ethyl, isopropyl, t-butyl, pentyl, heptyl, 1-ethylpentyl, benzyl, 2-ethoxyethyl, and 1-carboxymethyl), an alkenyl group (preferably an alkenyl group having 2 to 20 carbon atoms, for example, vinyl, allyl, and oleyl), an alkynyl group (preferably an alkynyl group having 2 to 20 carbon atoms, for example, ethynyl, butadiynyl, and phenylethynyl), a cycloalkyl group (preferably a cycloalkyl group having 3 to 20 carbon atoms, for example, cyclopropyl, cyclopentyl, cyclohexyl, and 4-methylcyclohexyl), an aryl group (preferably an aryl group having from 6 to 26 carbon atoms, for example, phenyl, 1-naphthyl, 4-methoxyphenyl, 2-chlorophenyl, and 3-methylphenyl), a heterocyclic group (preferably a heterocyclic group having 2 to 20 carbon atoms, for example, 2-pyridyl, 4-pyridyl, 2-imidazolyl, 2-benzimidazolyl, 2-thiazolyl, and 2-oxazolyl), an alkoxy group (preferably an alkoxy group having 1 to 20 carbon atom(s), for example, methoxy, ethoxy, isopropyloxy, and benzyloxy), an aryloxy group (preferably an aryloxy group having from 6 to 26 carbon atoms, for example, phenoxy, 1-naphthyloxy, 3-methylphenoxy, and 4-methoxyphenoxy), an alkoxycarbonyl group (preferably an alkoxycarbonyl group having 2 to 20 carbon atoms, for example, ethoxycarbonyl and 2-ethylhexyloxycarbonyl), an amino group (preferably an amino group having 0 to 20 carbon atom(s), for example, amino, N,N-dimethylamino, N,N-diethylamino, N-ethylamino, and anilino), a sulfonamide group (preferably a sulfonamide having 0 to 20 carbon atom(s), for example, N,N-dimethylsulfonamide, and N-phenylsulfonamide), an acyloxy group (preferably an acyloxy group having 1 to 20 carbon atom(s), for example, acethyloxy and benzoyloxy), a carbamoyl group (preferably a carbamoyl group having 1 to 20 carbon atom(s), for example, N,N-dimethylcarbamoyl and N-phenylcarbamoyl), an acylamino group (preferably an acylamino group having1 to 20 carbon atom(s) for example, acetylamino and benzoylamino), a cyano group, and a halogen atom (for example, a fluorine atom, a chlorine atom, a bromine atom, and an iodine atom). Among them, an alkyl group, an alkenyl group, an aryl group, a heterocyclic group, an alkoxy group, an aryloxy group, an alkoxycarbonyl group, an amino group, an acylamino group, a cyano group, and a halogen atom are more preferable. An alkyl group, an alkenyl group, a heterocyclic group, an alkoxy group, an alkoxycarbonyl group, an amino group, an acylamino group, and a cyano group are particularly preferable.

When the compound or substituents include an alkyl group, an alkenyl group or the like, these groups may be linear or branched, and may be substituted or unsubstituted. Further, when the compound or substituents include an aryl group, a heterocyclic group or the like, those groups may be monocyclic or fused-cyclic, and may be substituted or unsubstituted.

(Production of Siloxane Resin)

In the present invention, the siloxane resin contained in the resin composition for forming the light-transmissive cured film can be obtained by using the alkoxysilane raw material described above, through a hydrolysis reaction and a condensation reaction.

As for the hydrolysis reaction and the condensation reaction, known methods can be used. According to the necessity, a catalyst such as acid or base may be used. The catalyst is not limited in particular, as long as it enables to change a pH. Specifically, examples of the acid (organic acid or inorganic acid) include nitric acid, oxalic acid, acetic acid, and formic acid. Examples of alkali include ammonia, triethylamine, and ethylenediamine. The use amount of the catalyst is not limited in particular, as long as a hydrolysis condensate is produced so that the predetermined molecular weight of the siloxane can be attained.

According to the necessity, a solvent may be added to a reaction system of the hydrolysis reaction and the condensation reaction. The solvent is not limited in particular, as long as the hydrolysis reaction and the condensation reaction can be conducted. Examples of the solvent include water, alcohols such as methanol, ethanol, and propanol, ethers such as ethylene glycol monomethyl ether, ethylene glycol monoethyl ether, and ethylene glycol monopropyl ether, esters such as methyl acetate, ethyl acetate, butyl acetate, and propylene glycol monomethyl ether acetate, and ketones such as acetone, methyl ethyl ketone, methyl isobuthyl ketone, and methyl isoamyl ketone. Especially, as for the solvent used in this reaction system, it is preferable to use a solvent different from the solvent described below that is used to contain the siloxane resin. Further, it is more preferable to use alcohol compounds having 1 to 5 carbon atom(s), or ether compounds having 2 to 6 carbon atoms, or methyl isobutyl keton.

As for the conditions (temperature, period of time, and amount of solvent) for the hydrolysis reaction and the condensation reaction, optimum conditions are appropriately selected in accordance with the kind of materials to be used.

The weight average molecular weight of the siloxane resin used in the present invention is from 1,000 to 50,000. Especially, the weight average molecular weight is preferably from 2,000 to 45,000, more preferably from 2,500 to 25,000, and particularly preferably from 3,000 to 25,000. By controlling the weight average molecular weight within the above range, an especial excellent embedding property for the inside of the gap can be realized, which is preferable. In the case where the weight average molecular weight is the above-described lower limit or more, a coating property for a substrate is especially good and the surface state after coating and planarization is favorably maintained, which is preferable. In the case where the weight average molecular weight is the above-described upper limit or less, the embedding property is favorably realized, which is preferable.

Herein, the weight average molecular weight is a value that is obtained by measurement using a known GPC (Gel Permeation Chromatography) and standard polystyrene conversion. Unless indicated differently, the GPC measurement is conducted as follows. WATERS 2695 and GPC column KF-805L (3 columns in tandem) manufactured by Shodex are used as a column. To the column having a column temperature of 40° C., 50 µL of a tetrahydrofuran solution having a sample density of 0.5% by mass is poured. Tetrahydrofuran is flowed as an eluate solvent at the flow rate of 1 mL per minute. A sample peak is detected using a RI detecting device (WATERS 2414) and a UV detecting device (WATERS 2996).

The content of the siloxane resin in the resin composition for forming a light-transmissive cured film is more than 5 mass % and 50 mass % or less, more preferably 10 mass % or more and 45 mass % or less, particularly preferably 15 mass % or more and 40 mass % or less, to the total mass of the composition in the present invention. When the content is equal to or greater than the lower limit, voids are not easily generated, and the embedding property is particularly well. When the content is equal to or less than the upper limit, the film thickness is made sufficiently thick and does not cause the generation of cracks or the like, and the composition becomes highly practically useful.

(Surfactant Having a Polyoxyalkylene Structure)

In the present invention, the resin composition for forming a light-transmissive cured film (curable resin composition) contains a surfactant having a polyoxyalkylene structure, from the viewpoint of further enhancing coatability and the surface state properties. The term "polyoxyalkylene structure" represents a structure in which an alkylene group and a divalent oxygen atom are present adjacently to each other, and specific examples thereof include an ethylene oxide (EO) structure, and a propylene oxide (PO) structure. As the surfactant having a polyoxyalkylene structure, various surfactants such as fluorine-based surfactants, nonionic surfactants, cationic surfactants, anionic surfactants, and silicone-based surfactants can be used, as long as these surfactants have the polyoxyalkylene structure. Among these, nonionic surfactants, anionic surfactants, and silicone-based surfactants are preferred, nonionic surfactants and anionic surfactants are more preferred, and anionic surfactants are most preferred.

In the case of forming a film by using a coating liquid in which the resin composition for forming a light-transmissive cured film in the present invention is used, the surface tension of the surface to be coated and the coating liquid is decreased, so that wettability to the surface to be coated is improved and coatability to the surface to be coated is enhanced. Further, although the detailed operating mechanism is not clearly known, when the surfactant is used, the surface state after postbake is further ameliorated while the refractive index, planarization, and embedding property are maintained, and the resin composition can also cope with applications at higher demand levels, which is preferable.

Specific examples of the nonionic surfactant include glycerol, trimethylolpropane, ethoxylates and propoxylates of trimethylolethane (e.g. glycerol propoxylate, glycerin ethoxylate), polyoxyethylene lauryl ether, polyoxyethylene stearyl ether, polyoxyethylene oleyl ether (EMULGEN 404, manufactured by Kao Corporation), polyoxyethylene octylphenyl ether, polyoxyethylene nonylphenyl ether, polyethylene glycol dilaurate, polyethylene glycol distearate, and ELEBASE BUB-3 (manufactured by AOKI OIL INDUSTRIAL CO., LTD.).

Specific examples of the anionic surfactant include WO04, WO05, WO17 (manufactured by Yusho Co., Ltd.), EMULSOGEN COL-020, EMULSOGEN COA-070 and EMULSOGEN COL-080 (manufactured by Clariant (Japan) K. K.), and PLYSURF A208B (manufactured by Dai-ichi Kogyo Seiyaku Co., Ltd.).

Examples of the silicone-series surfactant include Toray silicone DC3PA, Toray silicone SH7PA, Toray silicone DC11PA, Toray silicone SH21PA, Toray silicone SH28PA, Toray silicone SH29PA, Toray silicone SH30PA, Toray silicone SH8400 (trade names, manufactured by Dow Corning Toray Co.,Ltd.), TSF-4440, TSF-4300, TSF-4445, TSF-4460 and TSF-4452 (trade names, manufactured by Momentive Performance Materials Inc.), KP341, KF6001, KF6002 (trade names, manufactured by Shin-Etsu Chemical Co., Ltd.), BYK307, BYK323 and BYK330 (trade name, manufactured by BYK Chemie), DBE-224 and DBE-621 (trade names, manufactured by GELEST).

Only one surfactant may be used, or two or more kinds of surfactants may be combined.

Further, the surfactant containing polyoxyalkylene structure preferably used in the present invention includes a surfactant represented by the following formula (4).

$$R^5O(R^6O)_mR^7 \qquad \text{Formula (4)}$$

(In formula (4), $R^5$ represents an alkyl group having 1 to 20 carbon atom(s); $R^6$ represents an alkylene group having 1 to 4 carbon atom(s); $R^7$ represents a hydrogen atom, a carboxyl group, —$PO_3H_2$, or, —$NH_2$; and m represents an integer of 1 to 8.)

More specifically, $R^5$ in formula (4) may be a straight or branched alkyl group. Among them, an alkyl group having 5 to 20 carbon atoms, more preferably 12 to 18 carbon atoms. $R^6$ in formula (4) may be a straight or branched alkylene group. Examples of the alkylene group include a methylene group, an ethylene group, a propylene group, an isopropylene group, a buthylene group, and an isobuthylene group. Among them, an ethylene group and an isopropylene group (a group that forms an ethylene oxide structure or a propylene oxide structure with an adjacent O atom) are preferable. $R^7$ in formula (4) preferably represents a hydrogen atom or a carboxyl group, and a carboxyl group is most preferable. When the surfactant represented by the above formula (4) is used, a balance can be achieved among planarization, embedding property, and surface state properties to a more preferred extent.

Although the amount to be added of the surfactant is not particularly limited, the lower limit thereof is preferably 1 mass part or more, more preferably 1.5 mass parts or more, most preferably 5.0 mass parts or more, to 100 mass parts of the siloxane resin. Although the upper limit is not particularly limited, it is preferably 30 mass parts or less, more preferably 20 mass parts or less. When the amount to be added is within this range, excellent surface state properties and embedding properties are obtained.

(Hardener)

In the present invention, the resin composition for forming a light-transmissive cured film may further contain a hardener. The hardeners are preferably hardeners composed of Al, Mg, Mn, Ti, Cu, Co, Zn, Hf and Zr. These may be used in combination thereof.

Such the hardener can be easily obtained by allowing a metal oxide to react with a chelating agent. Examples of the chelating agent that can be used include β-diketones such as acetylacetone, benzoylacetone, and dibenzoylmethane; and β-keto acid esters such as ethyl acetoacetate, and ethyl benzoylacetate.

Preferred specific examples of the metal group chelate compound include aluminum chelate compounds such as ethyl acetoacetate aluminum diisopropylate, aluminum tris (ethyl acetoacetate), alkyl acetoacetate aluminum diisopropylate, aluminum monoacetyl acetate bis(ethyl acetoacetate), and aluminum tris(acetyl acetonate); magnesium chelate compounds such as ethyl acetoacetate magnesium monoisopropylate, magnesium bis(ethyl acetoacetate), alkyl acetoacetate magnesium monoisopropylate, and magnesium bis(acetylacetonate); zirconium tetraacetylactonate, zirconium tributoxyacetylacetonate, zirconium acetylacetonate bis(ethylacetoacetate), manganese acetylacetonate, cobalt acetylacetonate, copper acetylacetonate, titanium acetylacetonate, and titanium oxyacetylacetonate. Among these, preferred examples include aluminum tris(acetylacetonate), aluminum tris(ethyl acetoacetate), magnesium bis(acetylacetonate), magnesium bis(ethyl acetoacetate), and zirconium tetraacetylacetonate, and in view of storage stability and easy availability, aluminum tris(acetylacetonate) and aluminum tris(ethyl acetoacetate) are particularly preferred.

The total content of the hardener is preferably 0.001 mass part to 5 mass parts, more preferably 0.01 mass part to 2 mass parts, particularly preferably 0.01 mass part to 0.5 mass part, to the total content of 100 mass parts of the siloxane resin. When the hardener is present, curing sufficiently proceeds, so that when a cured film is produced, satisfactory chemical resistance is obtained, and also, the resin composition has excellent surface state properties and embedding properties.

(Solvent)

In the present invention, the resin composition for forming a light-transmissive cured film (curable resin composition) can be generally prepared by using an organic solvent. The organic solvent is basically not limited in particular, as long as the solvent satisfies the dissolvability for various components and the coatability of the resin composition for forming a light-transmissive cured film, but it is preferable that the solvent be selected in consideration of the dissolvability for binder, coatability, and safety. Further, when the resin composition for forming a light-transmissive cured film in the present invention is prepared, the resin composition may include two kinds of organic solvents.

Suitable examples of the organic solvent include, as esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (examples: methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), 3-oxypropionic acid alkyl esters (examples: methyl 3-oxypropionate, and ethyl 3-oxypropionate (for example, methyl 3-methoxypropionate, ethyl 3-methoxypropionate, methyl 3-ethoxypropionate, and ethyl 3-ethoxypropionate)), 2-oxypropionic acid alkyl esters (examples: methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methylpropionate and ethyl 2-oxy-2-methylpropionate (for example, methyl 2-methoxy-2-methylpropionate, and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; as ethers, for example, diethylene glycol dimethyl ether, dipropylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol mono n-buthyl ether, propylene glycol mono tert-buthyl ether, propylene glycol monomethyl ether acetate, propylene glycol monoethyl ether acetate, propylene glycol monopropyl ether acetate, and ethylene glycol monobuthyl ether acetate; as ketones, for example, methyl ethyl ketone, cyclohexanone, 2-heptanone, and 3-heptanone; and as aromatic hydrocarbons, toluene and xylene.

Particularly preferred examples include methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, dipropylene glycol dimethyl ether, propylene glycol mono n-buthyl ether, propylene glycol mono tert-buthyl ether, and propylene glycol methyl ether acetate.

In the resin composition for forming a light-transmissive cured film used in the present invention, the content of the solvent to be applied is preferably 50 to 99.9 mass %, more preferably 60 to 95 mass %. When the content of the solvent is equal to or larger than the lower limit, it is preferable since coatability is improved. Also, when the content is equal to or smaller than the upper limit, it is preferable since coatability is similarly improved.

(Viscosity)

It is preferable that the resin composition for forming a light-transmissive cured film in the present invention have its viscosity adjusted, from the viewpoint of forming a satisfactory transmissive film having a thickness. Although the specific range of the viscosity is not particularly limited, it is preferably 1 to 30 cP, more preferably 2 to 20 cP, particularly preferably 3 to 15 cP. Unless particularly stated otherwise, the value of the viscosity in the present specification is obtained according to the measurement method described below.

Method of Measuring

The viscosity is measured at room temperature (approximately 25° C.), using an E type viscometer "TV-20 Viscometer, cone-plate type TVE-20L" (manufactured by Toki Sangyo Co., Ltd.). Sampling is carried out every 100 seconds, and the average of the values obtained by measuring viscosity five times is taken.

The term "composition" in the present specification represents that two or more components at a particular composition are substantially homogeneously present. Herein, being substantially homogeneous represents that various components may be unevenly distributed to the extent that the operating effects of the present invention are provided. Further, the term "composition" is not particularly limited in terms of the form as long as the definition described above is satisfied, and the term "composition" is not limited to a fluid liquid or paste, but represents to include a solid, a powder or the like, each including plural components. Furthermore, even in the case where a precipitate is present, one, that maintains a dispersed state for a predetermined time by stirring, is also meant to be included in the term "composition".

The light-transmissive cured film in the present invention may also be used as a low-refractive index film. Hereinafter, a preferred embodiment of using the light-transmissive cured film as a low-refractive index is described in detail.

(Low Refractive Index Film)

The cured film obtainable by using the composition described above exhibits excellent low refractive index property. In detail, the refractive index of the cured film (wavelength: 633 nm, measuring temperature: 25° C.) is preferably 1.5 or less, more preferably 1.25 to 1.46, furthermore preferably, 1.36 to 1.44, particularly preferably 1.40 to 1.42. When the refractive index is within the range described above, the cured film is useful as an antireflective film described below. The antireflective film preferably has a refractive index that is lower than that of the lens body on which the antireflective film is applied to and formed. Thereby, an effective antireflection effect may be obtained.

When the cured film is used as a low-refractive index film, the thickness thereof is preferably 0.5 μm or larger, and more preferably 0.6 μm or larger. Although the upper limit of the thickness is not particularly limited, it is preferably 3.0 μm or less, more preferably 2.5 μm or less. When the thickness is adjusted to be within this range, durability of the lens as a microlens unit is excellent, and even when used as a solid state imaging device described later, it is preferable since the adhesiveness to a cover glass is excellent. Particularly, when the film is thickly applied, the thickness may be larger than 1.0 μm. The term "thickness" as used herein represents the thickness from the height of the longest point of the lens body.

<Microlens Unit (Optical Member Set)>

The microlens unit according to the preferred embodiment of the present invention is incorporated into a solid state imaging device and has a microlens member and a light-transmissive cured film covering this microlens member. The term "microlens member" includes the meaning of a microlens array, and may collectively refer to microlens arrays, and may be simply referred to as ("lens member" or "lens members"). When a microlens array is used as a microlens member, it is ideal if the grooves which are the spacing between microlens bodies are embedded in the light-transmissive cured film without gaps, and no voids and the like are produced at all. In such an embodiment, the microlens unit does not generate noise attributable to voids in the light that passes through the unit, and provides satisfactory quality performance.

<Microlens Member (Second Optical Member)>

There are no particular limitations on the shape of the microlens member according to the present embodiment, but a convex lens is preferably used. The convex lens in to the present invention includes, unless particularly stated otherwise, a plano-convex lens, a convexo-convex lens, a convex meniscus lens, and the like, and refers to a lens having a site that is protruding in at least one direction. Specific examples of the shape of the convex lens include a polyhedral shape, a spherical shape, and a non-spherical shape (a shape having no spherical aberration that is formed at a free form surface). Examples of the polyhedral shape include a regular polyhedral shape, a semi-regular polyhedral shape, a round pillar shape, and a cylindrical shape. Further, a Fresnel lens and the like are also included in the convex lens in the present invention, if the lenses have a light-focusing effect.

In the present invention, the lens body may be made of a material which exhibits high refractive index properties. In detail, the refractive index of the lens member (wavelength: 633 nm, measuring temperature: 25° C.) is preferably 1.8 or more, more preferably 1.85 to 1.95. When the refractive index is within this range, when the lens body is used in combination with the antireflective film described above, a lens unit having good quality performance can be obtained.

As in the case of the present embodiment, in a preferred embodiment in which the microlens member is used in a microlens array, the protruding directions are arranged to face substantially the same direction. Herein, the term "arrangement" means that two or more lenses are provided in alignment at a predetermined interval, and the gaps between them may be uniform or may be different. Preferably, the lenses are two-dimensionally arranged on a single flat surface, and it is more preferable that the lenses are two-dimensionally arranged at an equal interval. Further, the interval (distance between the centers of lenses) between the lenses is usually in the range of 100 nm to 1,000 nm, and when closely packed, the interval is more preferably 100 nm to 400 nm. In most cases, concavity parts are formed between the lenses, and the shape thereof is determined by the shape of the protruding convex lens. In the case of a convex lens having a bow shape (a plane defined by an arc and a chord) in the cross-section, a convexity part having a cross-section composed of two V-shaped lines forming a reverse arc is formed.

The height (thickness) of the lens body is not particularly limited, but practically, the height is 200 to 1,000 nm. The width of the lens body is not particularly limited, but the width is practically 70% to 80% of a color filter size below (for example, when the color filter size is 1,400 nm, the width is 980 nm to 1,190 nm). The height of the lens body as used herein refers to the height of the longest point of the lens body.

In the case where the lens member is a convex lens, the radius of curvature thereof is not particularly limited, as long as it is within a range in which a desired effect is exhibited.

<Method of Producing Microlens Unit>

In the present invention, there are no particular limitations on an embodiment that can be adopted by the microlens unit, and can be appropriately selected depending on the use and purpose of the microlens unit. Specific examples of embodiment are described below, but the present invention is not intended to be limited to these embodiments. The term "coating" as used in the present specification is meant to include not only the case of coating a target by being in direct contact, but also the case of coating the target with another layer interposed therebetween.

First embodiment: An embodiment, in which a microlens member is directly coated with a light-transmissive cured film.

Second embodiment: An embodiment, in which a microlens member is coated with an overcoat layer, and is further coated with a light-transmissive cured film.

Third embodiment: An embodiment, in which a layer of a light-transmissive cured film is formed between a microlens member and a light-receiving unit of a semiconductor.

Among them, the first embodiment is preferred. In the following descriptions, the production method of the microlens unit of the first embodiment is described in detail.

(Coating of Composition)

The resin composition for forming a light-transmissive cured film in the present embodiment is preferably used as a material for forming an antireflective film and a low-refractive index film. There are no particular limitations on the method of applying the resin composition on a material to be processed such as a lens body in order to form a cured film. Any one of appropriate methods known as a coating method may be applied. For example, methods such as a spin coat method, a dip coat method, a roller blade method, or a spray method may be applied. It is preferable to remove a solvent contained in a coated film, according to the necessity, by subjecting the coated film to a heat treatment or the like.

As the coating amount, the conditions under which the thickness of the film after curing is 3 µm or less are preferred, more preferably 2.5 µm or less, and even more preferably 2 µm or less. There are no particular limitations on the lower limit, but the conditions under which the thickness of the film after curing is 0.1 µm or greater are preferred, more preferably 0.2 µm or greater, and particularly preferably 0.5 µm or greater. When the material to be processed has, for example, a conavo-convex shape in which a plural number of convex lenses are arranged in a solid state imaging device, the gap width of the trench-shaped part (in the case of a V-shaped groove, the width of the halfway up the groove) is typically approximately 100 nm to 300 nm. According to the composition in the present embodiment, the composition favorably conforms even to such a trench part, and the embedding property can be realized. Particularly, when the composition is thinly applied, since the viscosity is usually low, this embedding property does not easily cause a problem. However, when the composition is thickly applied, a satisfactory embedding property must be realized while a corresponding viscosity is maintained. Thus, it is difficult to achieve satisfactory embedding property. According to the resin composition for forming a light-transmissive cured film in the present embodiment, while the resin composition can realize a thick cured film, the resin composition favorably penetrates and adheres even to fine gaps between convex lenses, and thus satisfactory film formation can be achieved.

(Formation of Cured Film)

It is preferable that the resin composition for forming a light-transmissive cured film is applied, onto a material to be processed, and then a solvent is removed from the composition thereby to form a film. In order to do that, the coated film after coating is left under the conditions of preferably from 60° C. to 200° C., and more preferably from 100° C. to 150° C., and preferably from 1 minute to 10 minutes, and more preferably from 1 minute to 5 minutes. Further, the removal of the solvent may be performed over two or more times under different conditions.

In the present embodiment, the resin composition for forming a light-transmissive cured film thus applied is preferably heated to further accelerate curing. In this manner, a more stabilized form is realized, and development resistance can be increased. The heating temperature is not limited in particular, as long as the coated film is cured. Usually, the heating temperature is preferably from 150° C. to 400° C. Especially, the heating temperature is preferably from 150° C. to 280° C., and more preferably from 150° C. to 240° C. In the case of the above-described heating conditions, the coated film may be satisfactorily cured whereby an excellent film may be formed. The heating period of time is not limited in particular but preferably from 1 minute to 60 minutes and more preferably from 1 minute to 30 minutes. The heating method is not limited in particular. The heating by a hot plate, an oven, a furnace, or the like can be applied to the heating method.

The atmosphere in the time of heating is not limited in particular. Inactive atmosphere, oxidizing atmosphere, or the like can be applied to the heating atmosphere. The inactive atmosphere can be realized with inactive gas such as nitrogen, helium, argon. The oxidizing atmosphere can be realized by a mixed gas of such inactive gas and an oxidizing gas. Alternatively, air may be used. Examples of the oxidizing gas include oxygen, carbon monoxide, and oxygen dinitride. The heating step may be performed by any one of under pressure, under ordinary pressure, under reduced pressure and in vacuum.

The cured film obtained by the above-described heat treatment is mainly composed of an organic silicon oxide (SiOC). This enables to conduct etching of the material to be processed and the cured film with high dimensional accuracy, even if the material to be processed and the cured film have a fine pattern, as needed. As a result, this enables to favorably address the production process of a fine solid state imaging device.

(Antireflective Film)

An example of a favorable embodiment of use of the cured film obtained by using the composition according to the present invention described above, may be an antireflective film. Particularly, the cured film is suitable as an antireflective film for optical devices using a solid state imaging device or the like, for example, applications such as microlenses for image sensors, plasma display panels, liquid crystal displays, and organic electroluminescence. When the cured film is used as an antireflective film, a lower reflectance is more preferred. Specifically, the mirror-surface average reflectance in a wavelength region of 400 nm to 700 nm is preferably 3% or less, more preferably 2% or less, and most preferably 1% or less. A smaller reflectance is more preferred, and the reflectance is most preferably zero.

The haze of the antireflective film is preferably 3% or less, more preferably 1% or less, most preferably 0.5% or less. A smaller reflectance is more preferred, and the reflectance is most preferably substantially zero.

<Solid State Imaging Device>

The solid state imaging device according to the preferred embodiment of the present invention has a microlens unit on a semiconductor light-receiving unit, and the microlens unit is incorporated so as to be in contact with a microlens member and a color filter. A light-receiving element receives light that passes through a light-transmissive cured film, a lens body, and a color filter in this order, and functions as an image sensor. Specifically, the light-transmissive cured film functions as an antireflective film and enhances the light collection efficiency of the lens body. Thus, the light efficiently collected by the lens body passes through the color filter and is detected by the light-receiving element. Since these generally function in all of the elements that detect the light respectively corresponding to RGB, even in the case where light-receiving elements and lens bodies are arranged at a high density, very vivid images can be obtained.

As an example of the solid state imaging device to which a microlens array is applied, the solid state imaging device described in JP-A-2007-119744 may be mentioned. Specifically, there is a transport electrode between CCD regions or photoelectric conversion units formed on the surface of a semiconductor substrate, and a light-shielding film is formed thereon, with an interlayer film interposed therebetween. On the light-shielding film, an interlayer insulating film based on BPSG (Boro-Phospho-Silicate Glass) or the like, a passivation film, and a transparent planarization film having a low refractive index based on an acrylic resin or the like are laminated, and a color filter combining R. G. and B. is formed thereon. Further, a protective film is disposed, and a plurality of microlenses are arranged thereon such that the microlenses are located in the upper part of the photoelectric conversion unit, which is the light-receiving region.

The resin composition for forming a light-transmissive cured film of the present invention is preferably such that the resin composition is uniformly applied to cover this microlens array so as to embed the concavity and convexity surface, and to form a planarization surface, and the coated film is preferably considered as a cured film. Even in that case, as described above, it is preferable because satisfactory embedding property, the surface state and planarization when a cured film is formed can be realized. Particularly, the surface state or planarization at a thickness in the order of micrometers, which would never be realized in the conventional antireflective films having a thickness of several ten nanometers, can be realized, and satisfactory embedding property and development resistance can be realized.

The microlens unit according to the preferable embodiment of the present invention preferably has the following structure. That is, in the microlens unit, a plurality of convex lenses are applied as the microlens member, the plurality of the convex lenses are arranged such that the protruding directions of the convex lenses are substantially directed to the same direction, the plurality of the convex lenses are coated with the light-transmissive cured film by being covered from the protruding directions, the concavity parts formed between the plurality of the convex lenses are filled with the light-transmissive cured film substantially without gaps, and the side of the light-transmissive cured film opposite to the side, at which the lens member contact with is formed into a flat surface.

In the present specification, the term "the protruding directions of the convex lenses are substantially directed to the same direction" means that the protruding directions may not be completely the same as each other, and the protruding directions may have differences such as the inconsistency between thereof, as long as a desired effect is exhibited. On the other hand, the term "the plurality of the convex lenses are filled with the light-transmissive cured film substantially without gaps" means that there my be a fine gap between the first optical member and the second optical member, as long as a desired effect is exhibited.

The microlens unit of the present invention is also favorably used in other applications other than solid state imaging devices. Examples of the other applications include various OA instruments, liquid crystal TVs, mobile telephones, liquid crystal display elements such as projects, facsimiles, electronic copying machines, and imaging optical systems of on-chip color filters for solid state imaging devices, and the microlens unit can be used in these various applications.

EXAMPLES

The present invention will be described in more detail based on the following examples, but the invention is not intended to be limited thereto. In the following examples, the terms "part(s)" and "%" is a value by mass, unless otherwise specified.

(Synthesis of Siloxane Resin)

A hydrolytic condensation reaction was carried out using methyltriethoxysilane. The solvent used at this time was ethanol. The siloxane resin A-1 thus obtained had a weight average molecular weight of approximately 10,000. The weight average molecular weight was confirmed by GPC according to the procedure previously described.

Example 1

The components of the composition described below were mixed with a stirring machine, and thus a coating composition 101 (example according to the present invention) was prepared. The other component compositions were as indicated in Table 1.

(Composition)

| | |
|---|---|
| Siloxane resin (A-1) | 20 parts |
| Propyleneglycol monomethylether acetate (PGMEA) | 64 parts |
| Ethyl 3-ethoxypropionate (EEP) | 16 parts |
| Emulsogen COL-020 (manufactured by Clariant (Japan) K. K.) | 2 parts |

(Formation of Cured Film)

The coating composition obtained as described above was spin coated on an 8-inch bare silicon wafer at 1,000 rpm using a spin coater ACT-8 SOD manufactured by Tokyo Electron, Ltd., and thus a coated film was obtained. The coated film thus obtained was heated on a hot plate at 100° C. for 2 minutes, and after the heating, the coated film was instantly heated at 230° C. for 10 minutes. Thus, a cured film having a thickness of approximately 700 nm was formed.

[Evaluation of Refractive Index]

The refractive index of the film thus obtained (8 inch wafer) was measured using an ellipsometer (VUV-vase [trade name], manufactured by J. A. Woollam Co., Inc.). Sampling was carried out by making measurements at five points, and the average of the values was used, and a wavelength of 633 nm was used. The measurement temperature was set to 25° C.

[Planarization]

A film was prepared by applying the coating composition not on a silicon wafer but on a microlens pattern (for the dimensional data and the like, see the section for embedding property described below), and curing the coating composition. The film was cut such that the cross-sections of the various patterns would be exposed, and the cross-sections were observed by SEM. The results were judged in accordance with the following criteria. It is more preferable as the thickness difference is smaller irrespective of the presence or absence of pattern.

AA: Film thickness difference (e) was 50 nm or less.
A: Film thickness difference (e) was more than 50 nm and 100 nm or less.
B: Film thickness difference (e) was more than 100 nm and 150 nm or less.
C: Film thickness difference (e) was more than 150 nm.

[Embedding Property]

The film prepared by applying the coating composition not on a silicon wafer but on a microlens pattern (refractive index: 1.91), and curing the coating composition, was cut such that the cross-sections of the various patterns would be exposed, and these cross-sections were observed using a scanning electron microscope (SEM). At this time, the lens was a convex lens, and the width of one lens was 1 μm, while the height was 380 nm. The trench width between the lenses was 250 nm at a halfway up the V-shaped groove. The results were judged in accordance with the following criteria.

AA: There was no void.
A: A void with a diameter of less than 10 nm was confirmed.
B: A void with a diameter from 10 nm to less than 20 nm was confirmed.
C: There was a void with a diameter of 20 nm or more.

[Surface State]

In the formation of the cured film, a film (8 inch wafer) which was heated at 100° C. for 2 minutes and then was not heated at 230° C. was observed under an optical microscope. The results were judged in accordance with the following criteria.

AA: No unevenness or air bubble was observed.
A: Slight unevenness or air bubbles were observed, but at an acceptable level.
B: Unevenness or air bubbles were recognizable.
C: Not only unevenness or air bubbles, but even cissing occurred.

[Surface State after Heating]

In the formation of the cured film, a film obtained after heating at 230° C. (a wafer cut to a size of 5 cm×5 cm) was observed under an optical microscope. The results were judged in accordance with the following criteria.

AA: The occurrence of protrusions (confirmed as spots from the perpendicular direction of the film) was not observed.
A: The occurrence of two or fewer protrusions was observed.
B: The occurrence of more than two and less than twenty protrusions was observed.
C: The occurrence of twenty protrusions or more was observed.

[Thickness of Cured Film]

The thickness was measured by using an ellipsometer (VUV-vase [trade name], manufactured by J. A. Woollam Co., Inc.). Sampling was carried out by making measurements at five points, and the average of the values was used.

Further, coating compositions were prepared in the same manner as in the coating composition 101, except that the formulations were changed as indicated in Table 1, the resin raw materials were changed, and curing agents were added. The coating compositions were subjected to the same evaluations as described above. The results are shown in Table 1.

TABLE 1

| | Raw material of resin | | | | Curing agent | | Surfactant | |
|---|---|---|---|---|---|---|---|---|
| No. | MTES* | PhTES* | TEOS* | Addition amount (g) | Kind | Addition amount (g) | Kind | Addition amount (g) |
| 101 | 100 | — | — | 20 | — | — | EMUL-020 | 2 |
| 102 | 100 | — | — | 15 | — | — | EMUL-020 | 2 |
| 103 | 100 | — | — | 25 | — | — | EMUL-020 | 2 |
| 104 | 100 | — | — | 20 | — | — | EMUL-020 | 0.5 |
| 105 | 100 | — | — | 20 | — | — | EMUL-020 | 3 |
| 106 | 100 | — | — | 20 | — | — | EMUL-080 | 3 |
| 107 | 100 | — | — | 20 | — | — | EMUL-080 | 1 |
| 108 | 100 | — | — | 20 | — | — | EMUL-070 | 1.5 |
| 109 | 100 | — | — | 30 | — | — | EMUL-070 | 4 |
| 110 | 100 | — | — | 25 | — | — | BUB-3 | 1.5 |
| 111 | 100 | — | — | 20 | — | — | BUB-3 | 3 |
| 112 | 100 | — | — | 20 | — | — | A208B | 3 |
| 113 | 100 | — | — | 20 | — | — | EMULGEN 404 | 1.5 |
| 114 | 100 | — | — | 35 | — | — | DBE-224 | 1.5 |
| 115 | 100 | — | — | 20 | — | — | DBE-621 | 2 |
| 116 | 100 | — | — | 20 | AAc | 0.004 | EMUL-020 | 2 |
| 117 | 100 | — | — | 20 | AAc | 0.002 | EMUL-020 | 2 |
| 118 | 100 | — | — | 20 | ZAc | 0.02 | EMUL-020 | 2 |
| 119 | 95 | 5 | — | 20 | — | — | EMUL-020 | 2 |
| 120 | 70 | — | 30 | 20 | — | — | EMUL-080 | 2.5 |
| 121 | 100 | — | — | 40 | — | — | EMUL-020 | 3 |
| 122 | 100 | — | — | 35 | — | — | EMUL-020 | 2 |
| C11 | — | 100 | — | 20 | — | — | — | — |
| C12 | — | — | 100 | 20 | — | — | — | — |
| C13 | 100 | — | — | 20 | — | — | — | — |
| C14 | 100 | — | — | 20 | — | — | S-131 | 2 |

TABLE 1-continued

| No. | Refractive index | Thickness Approximately μm | Planarization | Embedding property | Surface state Before 230° C. heating | After 230° C. heating |
|---|---|---|---|---|---|---|
| 101 | 1.40 | 0.7 | AA | AA | AA | AA |
| 102 | 1.40 | 0.7 | AA | AA | AA | AA |
| 103 | 1.40 | 0.7 | AA | AA | AA | AA |
| 104 | 1.40 | 0.7 | AA | AA | AA | A |
| 105 | 1.41 | 0.7 | AA | AA | AA | AA |
| 106 | 1.41 | 0.7 | AA | AA | A | AA |
| 107 | 1.41 | 0.7 | AA | AA | A | A |
| 108 | 1.40 | 0.7 | AA | A | AA | AA |
| 109 | 1.41 | 1.5 | AA | AA | A | AA |
| 110 | 1.41 | 1.0 | A | AA | AA | AA |
| 111 | 1.41 | 0.7 | AA | AA | A | AA |
| 112 | 1.41 | 0.7 | AA | AA | A | AA |
| 113 | 1.41 | 0.7 | AA | AA | AA | A |
| 114 | 1.42 | 2.0 | AA | AA | A | A |
| 115 | 1.41 | 0.7 | AA | AA | AA | A |
| 116 | 1.41 | 0.7 | AA | AA | AA | AA |
| 117 | 1.40 | 0.7 | AA | AA | AA | AA |
| 118 | 1.41 | 0.7 | AA | AA | AA | AA |
| 119 | 1.44 | 0.7 | A | A | A | A |
| 120 | 1.43 | 1.0 | A | A | A | A |
| 121 | 1.40 | 3.0 | AA | AA | A | AA |
| 122 | 1.40 | 2.0 | AA | AA | AA | AA |
| C11 | 1.56 | 0.7 | C | B | A | A |
| C12 | 1.46 | 0.7 | C | C | B | A |
| C13 | 1.41 | 0.7 | AA | AA | AA | C |
| C14 | 1.42 | 0.7 | AA | AA | A | C |

*mass % (The total amount of the raw resin material is set as 100 mass %)

The abbreviations used in the examples according to the present invention and the comparative examples are as follows.
(Raw Material of Siloxane Resin)
  MTES: Methyl triethoxysilane
  PhTES: Phenyltriethoxysilane
  TEOS: Tetraethoxysilane
(Surfactant)
  EMUL-020: Emulsogen COL-020 (anionic surfactant, manufactured by Clariant) RO-(EO)$_2$—COOH <R: alkyl>
  EMUL-070: Emulsogen COA-070 (anionic surfactant, manufactured by Clariant) RO-(EO)$_7$—COOH <R: alkyl>
  EMUL-080: Emulsogen COL-080 (anionic surfactant, manufactured by Clariant) RO-(EO)$_8$—COOH <R: alkyl>
  BUB-3: ELEBASE BUB-3 (nonionic surfactant, manufactured by AOKI OIL INDUSTRIAL CO., LTD.) $C_4H_9$—O—(PO)$_n$—H <P: propylene>
  A208B: PLYSURF A208B (anionic surfactant, manufactured by DAI-ICHI KOGYO SEIYAKU CO., LTD.) RO-(EO)$_n$—PO$_3$H$_2$ <R: alkyl>
  EMULGEN 404: EMULGEN 404 (nonionic surfactant, manufactured by Kao Corporation) RO-(EO)$_n$—H<E: ethylene, R: alkyl>
  DBE-224: DBE-224 (silicone-series surfactant, manufactured by AZmax.co.)
  DBE-621: DBE-621 (silicone-series surfactant, manufactured by AZmax.co.)
  S-131: SURFLON S-131 (fluorine-containing surfactant not containing polyoxyalkylene structure, manufactured by AGC SEIMI CHEMICAL CO., LTD.)
(Curing Agent)
  AAc: Aluminium acetyl acetonate
  ZAc: Zirconium acetyl acetonate The microlens units which included the light-transmissive cured films formed by using the coating compositions 101 to 122 according to the present invention, all had satisfactory transparency and optical characteristics. Further, as indicated in Table 1 above, satisfactory planarization at the unit surface s was realized, fillability (embedding property) at the depression c was realized, and a highly excellent surface state was realized.

Example 2

In an example 2, each of coating compositions was prepared and evaluated in the same manner as the example 1, expect that, in the (Composition) of the example 1, PGMEA and EEP were replaced with 80 parts of propylene glycol mono n-buthyl ether (PnB). In the example 2, good results were obtained as the example 1.

Example 3

In an example 3, each of coating compositions was prepared and evaluated in the same manner as the example 1, expect that, in the (Composition) of the example 1, PGMEA and EEP were replaced with 80 parts of propylene glycol mono tert-buthyl ether (PTB). In the example 3, good results were obtained as the example 1.

Example 4

In an example 4, each of coating compositions was prepared and evaluated in the same manner as the example 1, expect that, in the (Composition) of the example 1, PGMEA and EEP were replaced with 80 parts of dipropylene glycol dimethyl ether (DMM). In the example 4, good results were obtained as the example 1.

Example 5

In an example 5, each of coating compositions was prepared and evaluated in the same manner as the example 1, expect that, in the (Composition) of the example 1, PGMEA and EEP were replaced with 80 parts of 2-heptanone. In the example 5, good results were obtained as the example 1.

Example 6

In an example 6, each of coating compositions was prepared and evaluated in the same manner as the example 1, expect that, in the (Composition) of the example 1, PGMEA and EEP were replaced with 80 parts of EEP. In the example 6, good results were obtained as the example 1.

Example 7

In an example 7, each of coating compositions was prepared and evaluated in the same manner as the example 1, expect that, in the (Composition) of the example 1, PGMEA and EEP were replaced with 80 parts of PGMEA. In the example 7, good results were obtained as the example 1.

Example 8

Each of coating compositions 201, 202, 203, 204, 205 and C21 was prepared in the same manner as the example 1, except that, in the (Composition) of the example 1, PGMEA and EEP were replaced with 80 parts of PnB, 80 parts of PTB, 80 parts of DMM, 80 parts of 2-heptanone, 80 parts of EEP and 80 parts of PGMEA, respectively. With respect to each of the coating compositions 201, 202, 203, 204, 205 and C21 and the coating composition 101, unevenness of coating was evaluated. The results are shown in the following Table 2.

[Unevenness of Coating]

Each of the coating compositions prepared by changing the solvent of the coating composition 101 was coated not on a silicon wafer but on a microlens pattern (with respect to dimensional data and the like, refer to the item "Embedding Property") and cured, thereby to obtain a film. Each of the thus-obtained films after being cured was observed under sodium lamp. The results were evaluated based on the following criteria.

AA: There is no vein over the entire film.
A: A vein was very slightly deposited on the surrounding area of the film.
B: A vein was slightly deposited on the surrounding area of the film; however it was allowable in practice.
C: Veins were deposited over the entire film; it was impracticable.

TABLE 2

| Coating composition No. | Unevenness of coating |
|---|---|
| 101 | B |
| 201 | AA |
| 202 | AA |
| 203 | AA |
| 204 | A |
| 205 | B |
| C21 | C |

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2011-217967 filed in Japan on Sep. 30, 2011, Patent Application No. 2011-287850 filed in Japan on Dec. 28, 2011 and Patent Application No. 2012-167634 filed in Japan on Jul. 27, 2012, each of which is entirely herein incorporated by reference.

The invention claimed is:

1. A curable resin composition, for forming a first optical member of an optical member set, the optical member set having the first optical member and a second optical member covered with the first optical member set, the first optical member being formed by curing a siloxane resin, the curable resin composition comprising:
    a siloxane resin, a surfactant, and a solvent,
    the siloxane resin and the surfactant being contained in the solvent,
    the surfactant having a polyoxyalkylene structure, and
    100% by mass of the total amount of the siloxane resin contained in the resin composition having a polysilsesquioxane structure represented by formula (1):

—(R$^1$SiO$_{3/2}$)$_n$—      Formula (1)

wherein R$^1$ represents an alkyl group having 1 to 3 carbon atom(s); and n represents an integer of 20 to 1,000, and the siloxane resin being a resin obtained by hydrolytic condensation of an alkyltrialkoxysilane represented by formula (2) as a raw material, R$^2$Si(OR$^3$)$_3$      Formula (2)

wherein R$^2$ represents an alkyl group having 1 to 3 carbon atom(s); and R$^3$ represents an alkyl group, and
    wherein the surfactant having a polyoxyalkylene structure is represented by the following formula (4):

R$^5$O(R$^6$O)$_m$R$^7$      Formula (4)

wherein, in formula (4), R$^5$ represents an alkyl group having 1 to 20 carbon atom(s); R$^6$ represents an alkylene group having 1 to 4 carbon atom(s); R$^7$ represents a hydrogen atom, a carboxyl group, —PO$_3$H$_2$, or —NH$_2$; and m represents an integer of 1 to 8.

2. The curable resin composition according to claim 1, wherein the content of the surfactant is within a range from 1 part by mass to 30 parts by mass, relative to 100 parts by mass of the siloxane resin.

3. The curable resin composition according to claim 1, wherein the solvent is an organic solvent.

4. The curable resin composition according to claim 1, wherein R$^7$ represents a carboxyl group, —PO$_3$H$_2$, or —NH$_2$.

5. The curable resin composition according to claim 1, wherein R$^7$ represents a carboxyl group or —PO$_3$H$_2$.

6. The curable resin composition according to claim 1, wherein R$^7$ represents a carboxyl group.

7. The curable resin composition according to claim 1, further containing a hardener comprising Al, Mg, Mn, Ti, Cu, Co, Zn, Hf, or Zr, or a combination thereof.

8. The curable resin composition according to claim 1, wherein the weight average molecular weight of the siloxane resin is from 3,000 to 25,000.

9. An optical member set, comprising:
a first optical member and a second optical member covered with the first optical member, the first optical member formed by curing the curable resin composition according to claim 1.

10. The optical member set according to claim 9, wherein the first optical member has a refractive index of 1.36 to 1.44.

11. The optical member set according to claim 9, wherein the second optical member has a refractive index of 1.85 to 1.95.

12. The optical member set according to claim 9, wherein the first optical member has a film shape and the film thickness thereof is from 0.5 µm to 3.0 µm.

13. The optical member set according to claim 9, wherein the second optical member is a microlens member.

14. A solid state imaging device, comprising the optical member set according to claim 9, and a semiconductor light-receiving unit.

15. A method of producing an optical member set, the optical member set having a first optical member and a second optical member coated with the first optical member, the first optical member being formed by curing the curable resin composition according to claim 1, the method comprising the steps of:

preparing a coating liquid comprising the curable resin composition according to claim 1;

applying the coating liquid on the second optical member; and curing the coating liquid and thereby forming the first optical member of a light-transmissive cured film.

16. The method of producing an optical member set according to claim 15, comprising the steps of: heating the cured first optical member; and thereby conducting a post-bake.

* * * * *